United States Patent
Pirich et al.

(10) Patent No.: US 8,591,987 B2
(45) Date of Patent: Nov. 26, 2013

(54) MULTIFERROIC NANOSCALE THIN FILM MATERIALS, METHOD OF ITS FACILE SYNTHESES AND MAGNETOELECTRIC COUPLING AT ROOM TEMPERATURE

(75) Inventors: Ronald Pirich, Islip, NY (US); Nan-Loh Yang, Staten Island, NY (US); Kai Su, White Plains, NY (US); I-Wei Chu, Staten Island, NY (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 488 days.

(21) Appl. No.: 12/777,175

(22) Filed: May 10, 2010

(65) Prior Publication Data

US 2010/0288964 A1 Nov. 18, 2010

Related U.S. Application Data

(60) Provisional application No. 61/179,214, filed on May 18, 2009.

(51) Int. Cl.
*B05D 5/12* (2006.01)
*B05D 3/12* (2006.01)
*B05D 3/14* (2006.01)

(52) U.S. Cl.
USPC ........... 427/240; 427/532; 427/547; 427/598; 427/376.2; 427/425

(58) Field of Classification Search
USPC .............. 427/240, 425, 376.2, 547, 532, 598
See application file for complete search history.

(56) References Cited

U.S. PATENT DOCUMENTS

| | | |
|---|---|---|
| 4,129,525 A | 12/1978 | Horowitz et al. |
| 5,015,461 A | 5/1991 | Jacobson et al. |
| 5,073,537 A | 12/1991 | Hung et al. |
| 5,132,100 A | 7/1992 | Abe |
| 5,508,256 A | 4/1996 | Kumagi et al. |
| 5,516,363 A | 5/1996 | Azuma et al. |
| 6,770,256 B1 | 8/2004 | Kaliaguine et al. |
| 6,830,822 B2 | 12/2004 | Yadav |
| 7,056,471 B1 | 6/2006 | Han et al. |
| 7,105,145 B2 | 9/2006 | Seol et al. |
| 7,138,098 B2 | 11/2006 | Bawendi et al. |
| 7,238,978 B2 | 7/2007 | Miyazawa et al. |
| 7,326,398 B2 | 2/2008 | Domen et al. |
| 7,399,429 B2 | 7/2008 | Liu et al. |
| 7,436,013 B2 | 10/2008 | Miyazawa et al. |
| 7,560,089 B2 | 7/2009 | Takao et al. |
| 7,573,734 B2 | 8/2009 | Grino et al. |

(Continued)

OTHER PUBLICATIONS

Wada et al. "Magnetic properties of amorphous-like oxides of the Bi2O3-Fe2O3-PbTiO3 system synthesized by sol-gel method", Materials Science and Engineering, 1996, A217/218, pp. 414-418.*

(Continued)

*Primary Examiner* — Kirsten Jolley
(74) *Attorney, Agent, or Firm* — Stetina Brunda Garred & Brucker

(57) ABSTRACT

Methods of producing a multiferroic thin film material. The method includes the steps of providing a multiferroic precursor solution, subjecting the precursor solution to spin casting to produce a spin cast film, and heating the spin cast film. The precursor solution may include $Bi(NO_3)_3 \cdot 5H_2O$ and $Fe(NO_3)_3 \cdot 9H_2O$ in ethylene glycol to produce a bismuth ferrite film. Further, the thin film may be utilized in varied technological areas, including memory devices for information storage.

15 Claims, 1 Drawing Sheet

(56) References Cited

U.S. PATENT DOCUMENTS

| | | |
|---|---|---|
| 7,585,474 B2 | 9/2009 | Wong et al. |
| 2005/0145908 A1 | 7/2005 | Moise, IV et al. |
| 2006/0025301 A1 | 2/2006 | Reddy et al. |
| 2006/0131627 A1* | 6/2006 | Kondo et al. ............... 257/295 |
| 2007/0138459 A1 | 6/2007 | Wong et al. |
| 2007/0164336 A1 | 7/2007 | Saito et al. |
| 2008/0024910 A1 | 1/2008 | Seigler |
| 2008/0145693 A1 | 6/2008 | Zou et al. |
| 2009/0050949 A1 | 2/2009 | Maruyama et al. |
| 2009/0059424 A1 | 3/2009 | Kim et al. |
| 2010/0140535 A1* | 6/2010 | Huang ..................... 252/62.59 |
| 2010/0208412 A1* | 8/2010 | Takashima et al. ........... 361/322 |
| 2010/0231095 A1* | 9/2010 | Kubota et al. ............... 310/357 |

OTHER PUBLICATIONS

Kanai et al. "Magnetic, electric, and optical functionalities of (PLZT)x(BiFeO3)1-x ferroelectric-ferromagnetic thin films", Journal of Physics and Chemistry of Solids, 2003, 64, pp. 391-397.*

Qi et al.'s "Epitaxial growth of BiFeO3 thin films by LPE and sol-gel methods", Journal of Magnetism and Magnetic Materials, 2004, 283, pp. 415-421.*

T.Zhao, A. Scholl, F. Zavaliche, K. Lee, M. Barry, A. Doran, M.P. Cruz, Y.H. Chu, C. Ederer, N.A. Spaldin, R.R. Das, D.M. Kim, S.H. Baek, C.B. Eom, and R. Ramesh, Electrical Control of Antiferromagnetic Domains in Multiferroic BiFEO3 Films at Room Temperature, (published online Sep. 3, 2006) Nature Materials, vol. 5, Oct. 2006, pp. 823-830, Nature Publishing Group, U.S.A.

* cited by examiner

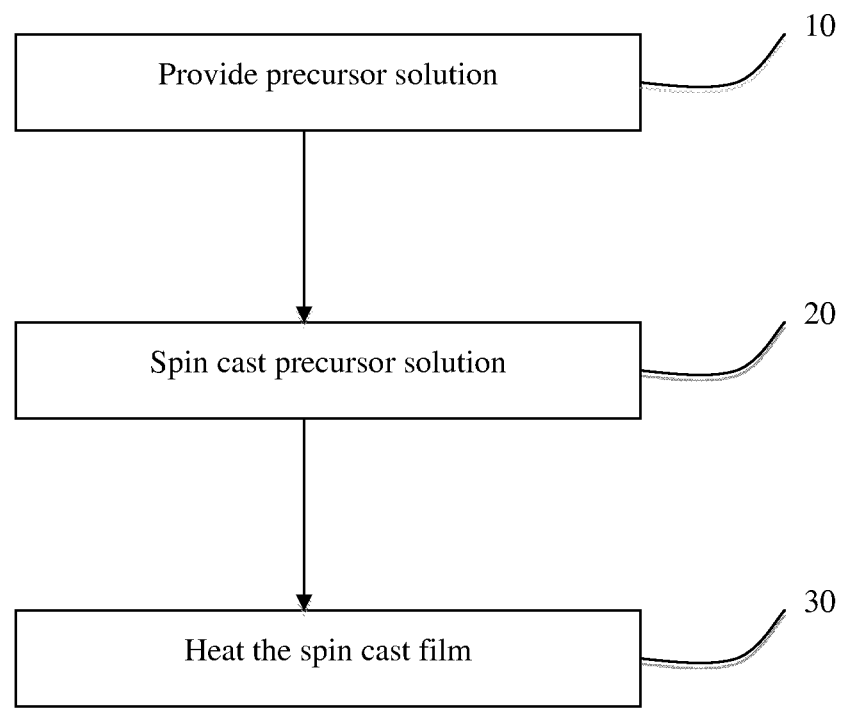

MULTIFERROIC NANOSCALE THIN FILM MATERIALS, METHOD OF ITS FACILE SYNTHESES AND MAGNETOELECTRIC COUPLING AT ROOM TEMPERATURE

CROSS-REFERENCE TO RELATED APPLICATIONS

This application claims the benefit of U.S. Provisional Application No. 61/179,214, filed on May 18, 2009, the teachings of which are expressly incorporated by reference.

STATEMENT RE: FEDERALLY SPONSORED RESEARCH/DEVELOPMENT

Not Applicable

BACKGROUND

1. Field of the Invention

The present invention relates to multiferroic thin film materials, and more particularly relates to methods of preparing said materials.

2. Description of Related Art

The investigation of multiferroics has recently emerged as one of the most exciting frontiers in material science. Multiferroics are magnetoelectric elements and have potential applications in the design and synthesis of multifunctional materials due to coupling of their coexisting unusual electric and magnetic orderings. The magnetic polarization can be switched by applying an electric field, and the ferroelectric polarization can be switched by applying a magnetic field. As a consequence, multiferroics are important materials for the investigation of fundamental physics, as well as in the design of new device concepts. These compounds not only present opportunities for magnetic and ferroelectric devices, but also can serve as the basis for potential applications including modulated optical properties, magnetoelectric multiferroic resonators, phase shifters, delay lines and filters for advanced microwave and millimeter wave applications, detectors for field fluctuation and field monitoring, information storage, the emerging field of spintronics, and sensors.

The behaviors of magnetoelectric coupling in multiferroics are of prime significance. Among the many multiferroics, bismuth ferrite ($BiFeO_3$) is known to be the only material that displays multiferroism at room temperature and has attracted considerable attention. Magnetoelectric coupling in $BiFeO_3$ thin film has not previously been developed. Electrical control of magnetic domain structure in multiferroic $BiFeO_3$ thin films at room temperature was first observed in 2006. However, ferroelectric polarization switched by a magnetic field has not previously been documented.

The use of multiferroic compounds, including $BiFeO_3$, has previously been disclosed, as has different methods for synthesizing multiferroic thin films, such as, pulsed laser deposition (PLD), liquid-phase epitaxy, sol-gel methodology, and chemical solution deposition. However, all of the previously disclosed methods for synthesizing multiferroic thin films have required complicated, expensive procedures.

BRIEF SUMMARY

The present invention relates to a novel facile procedure of synthesizing $BiFeO_3$ nanocrystal (approximately 45 nm thick) thin film. The films produced by the methods of the present invention not only maintain the ferroelectric and magnetic properties of $BiFeO_3$, but also evidence magnetoelectric coupling (i.e., magnetic, as well as electric, switching) at room temperature on the same sample.

The present invention provides a method of preparing nanoscale multiferroic thin film materials capable of magnetoelectric coupling at room temperature, i.e., electrical field control of ferromagnetism (polarization) and magnetic field control of an electrical field (polarization). In one embodiment, these multiferroic thin film materials are ferrites and may be bismuth ferrites. The thin film multiferroic thin film materials produced by the methods of the present invention may be suitable for a variety of device applications, for example, but not limited to, memory devices, spintronics (magnetoelectrics), sensors, and other devices. For example, a memory device could utilize the multiferroic thin film materials of the present invention that are capable of being electronically written and magnetically read. One embodiment of the ferroelectric memory device may include the substitution of magnetic metal atoms for the Fe atoms at B-sites in a perovskite structure. These metal magnetic atom substitutions may be selected from the group including Mn, Ru, Co, and Ni, and may optional substitute for about 1% to about 10% of the Fe atoms located at B-sites. Additionally, or alternatively, the substituted magnetic metal atoms may have a higher valency than Fe and may be substituted at about 1% to about 30% of the B-sites. Other examples of uses for the multiferroic thin film materials of the present invention include applications for modulated optical properties, magnetoelectric multiferroic resonators, phase shifters, delay lines and filters for advanced microwave and millimeter wave applications, and detectors for field fluctuation and field monitoring.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 1 depicts a flowchart showing the steps of the present invention.

DETAILED DESCRIPTION

The detailed description set forth below is intended as a description of the presently preferred embodiment of the invention, and is not intended to represent the only form in which the present invention may be constructed or utilized. The description sets forth the functions and sequences of steps for constructing and operating the invention. It is to be understood, however, that the same or equivalent functions and sequences may be accomplished by different embodiments and that they are also intended to be encompassed within the scope of the invention.

The present invention provides a simple, low-cost procedure for producing a well-defined $BiFeO_3$ (BFO) nanocrystal thin film.

One embodiment of the present invention includes the steps of providing a multiferroic precursor solution 10, subjecting the precursor solution to spin casting to produce a spin cast film 20, and heating the spin cast film 30. In one embodiment, the multiferroic thin film material is a ferrite, and may in particular be a bismuth ferrite.

The multiferroic precursor solution may include bismuth, iron and oxygen. In particular, the multiferroic precursor solution may include $Bi(NO_3)_3 \cdot 5H_2O$ and $Fe(NO_3)_3 \cdot 9H_2O$. When the multiferroic precursor solution is made up of $Bi(NO_3)_3 \cdot 5H_2O$ and $Fe(NO_3)_3 \cdot 9H_2O$, they may be present in the solution in a 1:1 molar ratio. The precursor solution may be dissolved in any appropriate diluent. One example of an appropriate diluent is ethylene glycol.

After spin casting, the film is heated above room temperature. In particular, the film may be heated to a temperature of approximately 600° C.

The process of the present invention is capable of producing a uniform arrangement of nanocrystals in the final film. For example, the nanocrystals produced by the method of the present invention may be about 200 nm in diameter and about 45 nm in height.

The present invention further contemplates a multiferroic thin film material produced by the method disclosed herein. The multiferroic thin film material produced by the present methods may be capable of magnetoelectric coupling at about room temperature. This is in stark contrast to multiferroic materials present in the art which require cryogenic temperatures to enable magnetoelectric coupling. The resulting thin film material may be suitable in numerous applications, including, but not limited to, the use within memory devices for information storage.

When constructing such a ferroelectric memory device, it may be preferable to form the BFO ferroelectric layer in a perovskite structure in which some Fe atoms located at B-sites in the structure are substituted by magnetic metal atoms. For example, the magnetic metal atoms may be at least one of Mn, Ru, Co, and Ni. When such atoms are substituted at B-sites, the magnetism of the BFO ferroelectric layer is strengthened and its dielectric characterists improves, resulting in improved performance. These magnetic metal atoms may be substituted for about 1% to about 10% of the Fe located at all of the B-sites in the BFO layer. Alternatively, or additionally, the magnetic metal atoms may be atoms with higher valencies than that of Fe, such as, V, Nb, Ta, W, Ti, Zr, and Hf. By substituting B-sites with atoms having a higher valency than Fe, if Bi atoms at the A-sites evaporate, the higher valency atoms at the B-sites help to maintain the neutrality and insulation of the entire crystal, thereby preventing potential current leakage. In one embodiment, the substituted higher valency magnetic metal atoms are substituted for about 1% to about 30% of the Fe atoms located at all of the B-sites in the BFO layer.

A well-defined BFO nanocrystal thin film of an approximate thickness of 45 nm was obtained by performing the steps disclosed herein. That is, $Bi(NO_3)_3.5H_2O$ and $Fe(NO_3)_3.9H_2O$ in a 1:1 molar ratio were dissolved in ethylene glycol to produce a precursor solution. This precursor solution was then subjected to spin casting followed by heating at 600° C. The magnetic and electric orderings and their coupling in the multiferroic BFO film synthesized were observed at room temperature using Magnetic Force Microscopy (MFM) and Kelvin Probe Force Microscopy (KPFM). Room temperature couplings of magnetic and ferroelectric orders in the same multiferroic sample was observed.

X-Ray Diffraction (XRD) patterns of the BFO thin film clearly showed a crystal structure of rhombohedrally distorted perovskite. Furthermore, elemental analysis using X-ray Energy Dispersive Spectroscopy (XEDS) showed a one-to-one elemental ratio of bismuth to iron.

The morphology of the multiferroic thin film of the present invention was established using Scanning Electron Microscopy (SEM) and Atomic Force Microscopy (AFM). Both SEM and AFM results showed films with uniform and dense arrangement of nanocrystals having an average diameter of 200 nm and an average height of 45 nm. For the observation of the nanometer scale magnetic property of the BFO thin film, MFM measurements were performed ($\Delta Z$=82 nm, tip to surface) using a dynamic mode with a phase detection system. The resulting phase image clearly indicated magnetic ordering perpendicular to the sample surface (z-direction).

KPFM was used to measure the ferroelectric property of the BFO film ($\Delta Z$=50 nm). Various DC bias (−1V, +1V, and +2V) were applied to the topographical surface of the BFO film having an average height of 45 nm to write electric polarization and demonstrate potential features corresponding to particles with induced dipole. In order to remove the already existing surface charge and to observe the ferroelectric polarization, an AFM scan with zero bias was performed on the same region using a contact mode with a grounded tip. A DC bias was then applied from the substrate at different levels and directions to induce electric polarization. The surface potential at −1V DC bias clearly showed a negative (approximately −10 mV) polarization on the top surface of the BFO nanocrystals. After changing the DC bias from −1V to +1V, the polarization on BFO film showed a reversal of direction. When a higher positive bias of +2 DC was applied, a nearly inverted image was observed, indicating clearly that the polarization direction of the ferroelectric domains was switched by the external electrical field. It was also observed that the ferroelectric polarization maintained for at least 18.5 hours with only a moderate decrease after the electrical field was withdrawn.

To demonstrate the electric field induced magnetic order of the BFO film, an external electrical field was applied to the sample when MFM experiments were performed to image and manipulate magnetism of BFO film due to the applied electrical field. The magnetic tip was lifted to 100 nm to reduce to a negligible level the influence from the previously existing sample magnetic field. At $\Delta Z$=100 nm, the MFM phase image does not show significant magnetic interaction between the tip and the surface, indicating the influence on the magnetic tip was excluded. Various levels of DC bias were applied in the first trace to induce magnetism of the BFO film surface. After applying an electrical field, the induced magnetic image ordering of the BFO film was recorded. In order to monitor the levels of influence of positive electric field on the BFO film's magnetism, +2V and +4V DC bias were applied on the first trace of separate sets of continuous scans. It was established that higher bias fields led to stronger magnetic ordering. The time scale of the response time was demonstrated by a single 10-minute scan with bias stepped from zero to +2 and then to +4V.

To study the ferroelectric ordering induced by a magnetic field, the sample was placed in an external magnetic field before KPFM measurements. These imaging experiments are similar to normal KPFM, except no DC bias is applied on the surface. AFM topography was carried out first, followed by KPFM study. The Surface Potential (SP) image was recorded in second trace with $\Delta Z$=50 nm. Results from experiments on the same sample area with and without external magnetic field, were compared to the magnetoelectric coupling. In the first experiment, the SP image of BFO film was mapped without electrical or magnetic field, and showed no significant SP on the surface of the BFO film. After this first scan, the BFO film was positioned between two poles of a magnet with a pole gap of 0.5 inch and a field strength of 10,500 Oe for both 30 minutes and 15 hours. After 30 minutes and 15 hours of magnetization, the SP images were recorded. As was discovered, after 30 minutes of magnetization, the image starts to show SP on the surface of the BFO film. After 15 hours of magnetization, SP images show strong ferroelectric ordering. This is the first time that room temperature magnetic field induced electric polarization was observed. The induced ferroelectric ordering by magnetic field is not as efficient as ordering by electrical field, however.

The above description is given by way of example, and not limitation. Given the above disclosure, one skilled in the art could devise variations that are within the scope and spirit of the invention disclosed herein, including various optimizations of the precursor diluent, spin casting process, and heating length. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of producing a multiferroic thin film material, said method comprising the following steps:
   a. providing a precursor solution including a Bismuth solution and an Iron Nitrate solution;
   b. spin casting the precursor solution;
   c. heating the spin cast precursor solution such that the Bismuth solution and the Iron Nitrate solution react to form a multiferroic Bismuth Ferrite ($BiFeO_3$) film;
   d. forming the $BiFeO_3$ nanocrystals in a perovskite structure having Fe atoms located at B-sites in the perovskite structure;
   e. substituting magnetic metal atoms having a higher valency than Fe for the Fe atoms located at the B-sites in the perovskite structure, to maintain neutrality and insulation of the $BiFeO_3$ film; and
   f. wherein the $BiFeO_3$ film exhibits as substantially uniform arrangement of $BiFeO_3$ nanocrystals capable of magnetoelectric coupling at room temperature.

2. The method of claim 1, wherein the Bismuth and Iron Nitrate solution comprises $Bi(NO_3)_3.5H_2O$ and $Fe(NO_3)_3.9H_2O$, respectively.

3. The method of claim 2, wherein $Bi(NO_3)_3.5H_2O$ and $Fe(NO_3)_3.9H_2O$ are present in a 1:1 molar ratio.

4. The method of claim 2, wherein the $Bi(NO_3)_3.5H_2O$ and $Fe(NO_3)_3.9H_2O$ are dissolved in ethylene glycol.

5. The method of claim 1, wherein the spin cast precursor solution is heated in step (c) to about 600° C.

6. The method of claim 5, wherein the nanocrystals are about 200 nm in diameter and about 45 nm in height.

7. The method as recited in claim 1, further comprising the step of regulating the electrical field polarization of the $BiFeO_3$ nanocrystals in response to an applied magnetic field.

8. The method as recited in claim 1 wherein the $BiFeO_3$ nanocrystals are subject to magnetic field induced electric polarization at room temperature.

9. The method as recited in claim 1, further comprising the step of regulating the ferromagnetic polarization of the $BiFeO_3$ nanocrystals in response to an applied electrical field.

10. The method as recited in claim 1 wherein the $BiFeO_3$ nanocrystals are subject to electrical field control of the ferromagnetic polarization of the nanocrystals.

11. The method as recited claim 1 wherein the ferromagnetic characteristics of the nanocrystals are subject to electrical field control, and electrical field characteristics of the nanocrystals are subject to magnetic field control.

12. The method as recited in claim 1 wherein the electrical field characteristics of the nanocrystals are subject to magnetic field control.

13. The method as recited in claim 1 wherein the magnetic field characteristics of the nanocrystals are subject to electrical field control.

14. The method a recited in claim 1 wherein the higher valency magnetic metal atoms are substituted for about 1% to about 30% of the Fe atoms located at the B-sites.

15. The method as recited in claim 14 wherein the higher valency magnetic metal atoms are selected from the group consisting of V, Nb, Ta, W, Ti, Zr, and Hf.

* * * * *